United States Patent
Lzu et al.

(12) 
(10) Patent No.: US 6,183,189 B1
(45) Date of Patent: Feb. 6, 2001

(54) SELF ALIGNING WAFER CHUCK DESIGN FOR WAFER PROCESSING TOOLS

(75) Inventors: Erzhuang Lzu; Xiaosong Tang; Yih-Shung Lin; Charles Lin, all of Singapore (SG)

(73) Assignee: Chartered Semiconductor Manufacturing, Ltd., Singapore (SG)

( * ) Notice: Under 35 U.S.C. 154(b), the term of this patent shall be extended for 0 days.

(21) Appl. No.: 09/200,550

(22) Filed: Nov. 27, 1998

(51) Int. Cl.$^7$ ................................................. H01L 21/68
(52) U.S. Cl. ................................. 414/754; 414/936
(58) Field of Search .......................... 414/754, 784, 414/936, 941

(56) References Cited

U.S. PATENT DOCUMENTS

| | | | |
|---|---|---|---|
| 4,619,573 | 10/1986 | Rathmann et al. | 414/222 |
| 4,724,621 | 2/1988 | Hobson et al. | 34/218 |
| 5,643,366 | 7/1997 | Somekh et al. | 118/721 |

FOREIGN PATENT DOCUMENTS

| | | | | |
|---|---|---|---|---|
| 1-140739 | * | 6/1989 | (JP) | 414/936 |
| 3-34345 | * | 2/1991 | (JP) | 414/936 |
| 4-80940 | * | 3/1992 | (JP) | 414/936 |
| 4-167541 | * | 6/1992 | (JP) | 414/936 |

* cited by examiner

Primary Examiner—Janice L. Krizek
(74) Attorney, Agent, or Firm—George O. Saile; Rosemary L. S. Pike

(57) ABSTRACT

A wafer chuck for positioning and releasably holding a wafer includes a support platform having an upper surface for positioning and supporting the wafer. Wafer banking pins are affixed to the support platform for positioning the wafer. A lift device acting on the wafer when it rests on the support platform to move the wafer relative to the support platform in a slanted direction away from the support platform and wafer banking pins. The lift device has a plurality of wafer lifting fingers that cooperatively extend in a biased and substantially vertical direction are disposed in a pattern to be supportive of the wafer. Each of the wafer lifting fingers has an end portion that is movable relative to the support platform between a first position at which it is retracted from the upper surface of the support platform and a second position at which it protrudes from the upper surface of the support platform so as to engage the wafer to lift it relative to the support platform.

21 Claims, 3 Drawing Sheets

SELF ALIGNING WAFER CHUCK DESIGN FOR WAFER PROCESSING TOOLS

(1) TECHNICAL FIELD

This invention relates generally to wafer transfer and handling apparatus and more particularly to a mechanism for releasably holding and supporting a wafer in a wafer processing machine.

(2) DESCRIPTION OF THE PRIOR ART

The following three documents relate to methods dealing with wafer handling.

U.S. Pat. No. 5,643,366 issued Jul. 1, 1997 to Somekh et al., discloses wafer handling within a vacuum chamber using vacuum. The invention shows a robot insertion blade supports a wafer to be processed in a recess having conically sloping wafer holding surfaces which touch the wafer only at its outer periphery. Once positioned in the chamber, a set of three transfer finger with sloped contact surfaces supported from a "C" shaped support assembly raise the wafer adjacent to a susceptor bottom surface.

U.S. Pat. No. 4,724,621 issued Feb. 16, 1988 to Hobson et al., discloses a wafer processing chuck using slanted clamping pins. The invention shows lifting pins that receive a wafer from a transport device and lower the wafer to the surface of a chuck. Clamping pins lower and hold the wafer by means of enlargements on the ends of the clamping pins. Grooves on the surface of the chuck and internal channels in the chuck are used to supply gas to the back of the wafer for temperature control.

U.S. Pat. No. 4,619,573 issued Oct. 28, 1986 to Rathmann et al., teaches a wafer transport in the vacuum portion of an automated wafer processing machine that is accomplished by means of an improved transport mechanism.

With the existence of high throughput automatic process equipment, automatic wafer handling is most essential. The need for higher yield in the manufacture of semiconductor devices has driven the development and use of more highly automated semiconductor wafer handling apparatus. Furthermore, the need to reduce particulate levels in the processing areas has demanded the use of controlled wafer containment in which wafer transfer occurs. It is desirable that semiconductor wafer processing machines be easily reconfigurable to suit the needs of a particular manufacturing facility. Finally, any mechanical system which is to be part of a semiconductor wafer processing machine must be extremely reliable. This is due to the relatively high cost of down time in semiconductor facilities.

The prior art has failed to provide a wafer chuck apparatus which is simple, which reduces particulate generation, which is forgiving of the robotics handler positioning errors, and which is easily adaptable to various configurations of the machine in which it operates. The wafer transporting robot must be exacting in its handling of the fragile wafer and requires frequent calibration. Horizontal positioning is difficult to control as distances increase particularly with increasing wafer sizes and chamber dimensions. Degradation of the robot's precision will generate particulate contaminates (silicon chips and dust) within the PVD chamber thereby skewing the process. The prior art chuck does not provide sufficient tolerance for thermal expansion. Robot alignment must be done for each temperature set point, making it extremely inconvenient. Internal and environmental vibration will cause the wafer to bounce against the nesting locating pins thereby generating silicon dust.

DESCRIPTION OF THE INVENTION

In view of the prior art, it is a principle object of the present invention to provide an improved chuck apparatus for releasably holding and supporting a wafer within a wafer processing machine.

A further object of the present invention is to provide an efficient and reliable means for receiving the wafer from a wafer transport device while facilitating wafer alignment.

It is another object of the present invention to provide an efficient and reliable means for presenting and releasing the wafer to a wafer transport device without generating particulate contamination.

It is still another object of the present invention to provide a wafer chuck apparatus that is more forgiving of the robot's positioning errors.

It is yet another object of the present invention to easily reconfigure the wafer chuck apparatus to meet the needs of the particular processing machine.

These objects of the invention and other objects, features and advantages to become apparent as the specification progresses are accomplished by the invention, according to which, briefly stated, a group of lifting pins receives the wafer from the transport device and lowers the wafer to the chuck surface while banking the wafer against stationary locating pins on the chuck surface.

These and further constructional and operational characteristics of the invention will be more evident from the detailed description given hereafter with reference to the figures of the accompanying drawings which illustrate preferred embodiments and alternatives by way of non-limiting examples.

DETAILED DESCRIPTION OF THE PREFERRED EMBODIMENT

The fabrication of semiconductor devices is normally carried out at the wafer level. Disk-like wafers of semiconductor material comprising a relatively large number of individual devices proceed through the various manufacturing processes before being separated into individual die which each contain a single device, such as a memory or microprocessor chip. The need for higher yield manufacturing steps leads to more automated wafer processing systems which can process a larger number of wafers per day and within a cleaner process environment. Completing each process step as a cost effective operation depends greatly on the reliability of each operating element within the processing system.

The following wafer handling sequence is a conventional method used in the semiconductor industry. During an automatic PVD process, a robot is programmed to transfer a wafer from a wafer storage queue to a wafer chuck apparatus located in a PVD process chamber. The robot enters the process chamber gripping the wafer at its periphery and precisely positions the wafer over the wafer chuck apparatus. A plurality of wafer lifting fingers are extended to receive the wafer at a prescribed distance above a wafer support platform. After feedback sensors verify the precise position of the robot's wafer handler blades relative to the wafer lifting fingers, the wafer is released from the robot's handler blades to come to rest against the plurality of extended wafer lifting fingers. The wafer is then lowered by simultaneously retracting the plurality of wafer lifting fingers to a nested wafer support platform. The robot exits the PVD chamber and the PVD process is set to begin.

At the completion of the PVD process cycle, the robot reenters the process chamber and is precisely positioned over the wafer chuck apparatus. The plurality of wafer lifting fingers are simultaneously extended to lift the wafer from the nested wafer support platform to the prescribed wafer pick up position. The robot clamps the periphery of the wafer and removes the wafer for transport to a process completion queue.

This wafer handling sequence is also used in the invention, however, the distinction between them is summarized in the following detailed description.

Figure 1:
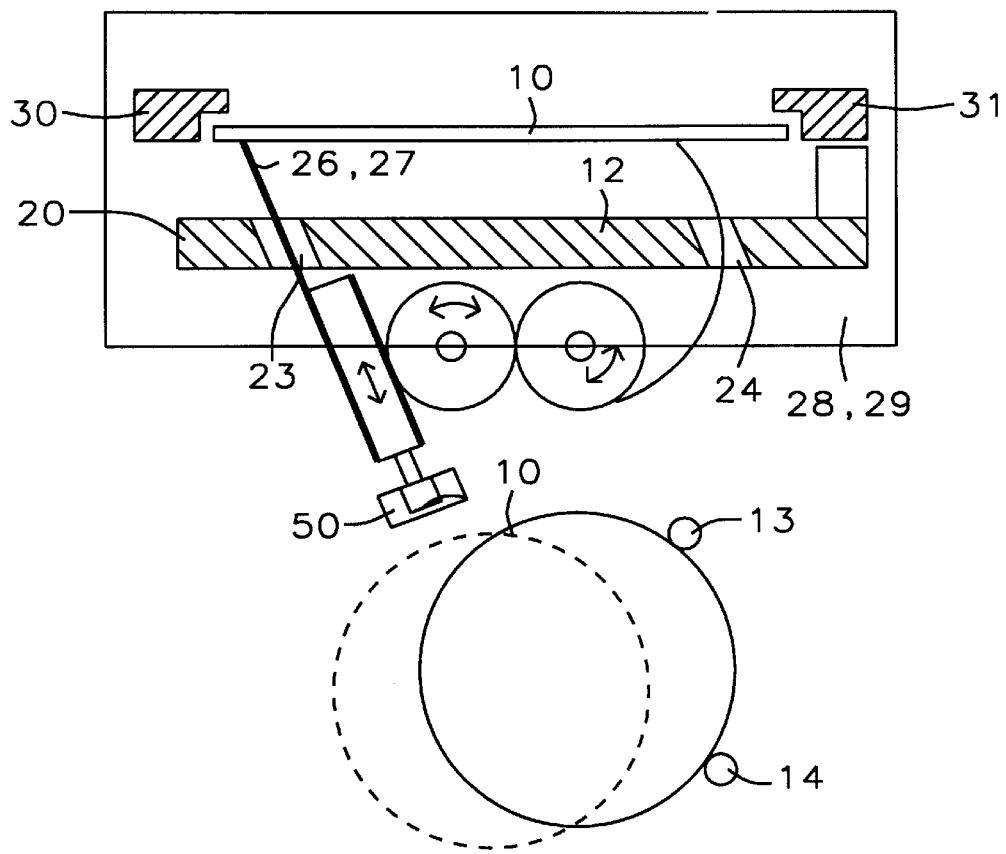
FIG. 1 is a schematic side view of a wafer chuck of the invention.
Figure 2:
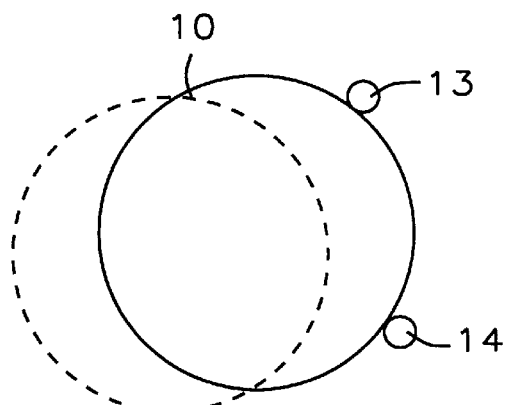
FIG. 2 is a schematic top view of a wafer chuck of the invention.
Figure 3:
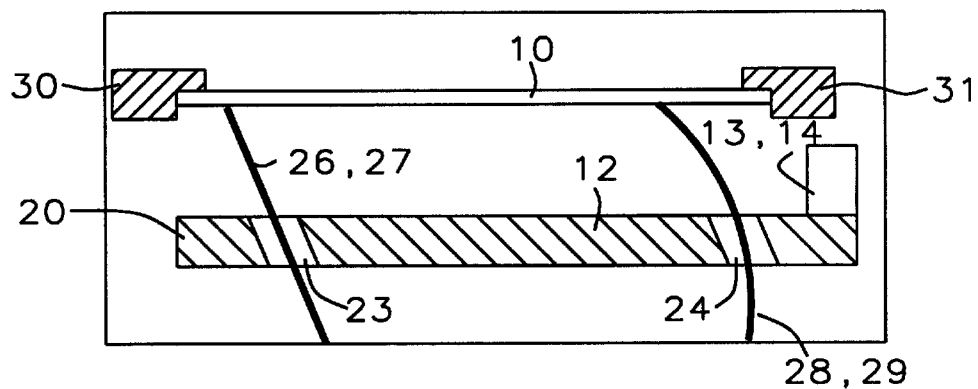
FIG. 3 is a schematic side view of a wafer in its extended position relative to locating pins of the invention.
Figure 4:
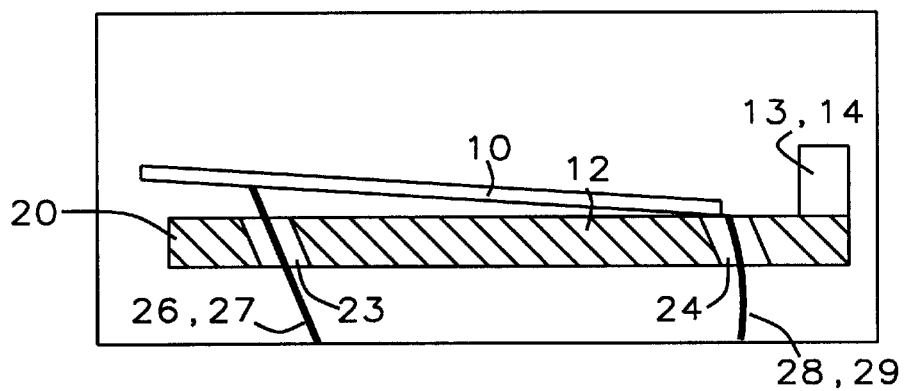
FIG. 4 is a schematic side view of a wafer in its intermediate position relative to locating pins of the invention.
Figure 5:
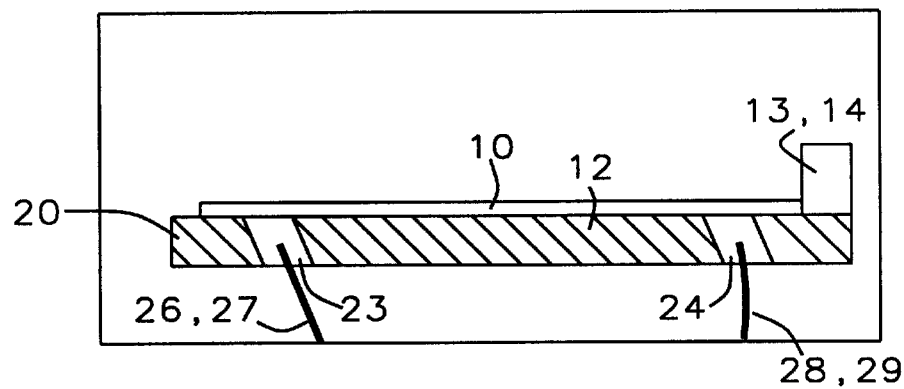
FIG. 5 is a schematic side view of a wafer in its final position relative to locating pins of the invention.
Figure 6:
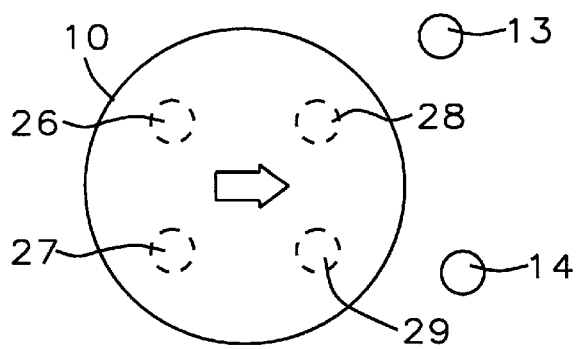
FIG. 6 is a schematic top view of a wafer in its extended position relative to locating pins of the invention.
Figure 7:
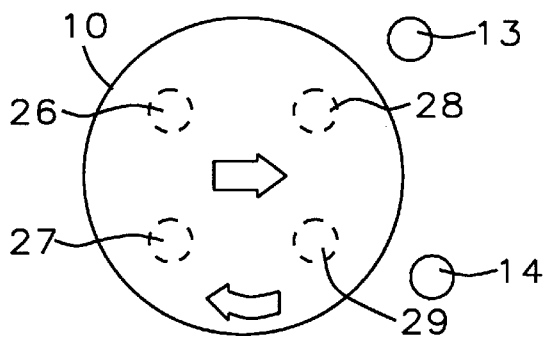
FIG. 7 is a schematic top view of a wafer in its intermediate position relative to locating pins of the invention.
Figure 8:
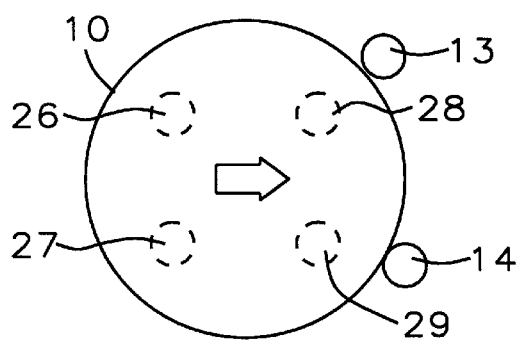
FIG. 8 is a schematic top view of a wafer in its final position relative to locating pins of the invention.

FIGS. 1 and 2 illustrate a schematic side and top view, respectively, of the wafer chuck 20 which embodies a number of improvements over the prior art. The particular apparatus shown includes a self aligning motion that moves a wafer 10 against wafer banking pins 13, 14 as it is lowered onto a wafer support platform 12. The lifting device acts on the wafer when it rests on the support platform to move the wafer relative to the support platform in a biased direction away from the support platform. The lifting device, which includes driving means 50, includes two pairs of retractable and extendible wafer lifting fingers 26, 27, and 28, 29 shown here in their extended position. A first pair 26, 27 rigidly passing, without contact, through holes 23, 24 in the wafer support platform 12, are distally placed with respect to the wafer banking pins 13, 14, and disposed at an angle relative to the horizontal plane of the wafer support platform 12 forming an angle away from its banking pins 13, 14. A second pair 28, 29 are formed having a radius of curvature to move curvilinearly and rigidly, through enlarged holes passing through the wafer support platform 12, are placed proximal the wafer banking pins, and coupled to be synchronous in movement so that at the beginning of the wafer lifting sequence, the second pair lags the first pair in lifting because of its near vertical radius of curvature, refer to FIGS. 3 through 8. FIGS. 3, 4, and 5 show the lowering of the wafer 10 sequence from a side view perspective, FIGS. 6, 7, and 8 show the lowering of the wafer 10 sequence from a top viewing perspective. This lagging action permits the first pair of wafer lifting fingers to tilt and pull the wafer away from the wafer banking pins 13, 14 during the wafer lifting sequence. Simultaneously, as the wafer is first tilted away from the wafer support platform, a horizontal twist of the wafer lifting fingers also rotates the wafer away from banking pin 13 and then 14. As the first and second pair continue to lift, the second pair catches up with the first pair and the wafer assumes a near horizontal position. Conversely, when lowering, the second pair precedes the first pair assuring wafer contact with the wafer banking pins. As the first pair continues to lower, the wafer is firstly pushed against banking pin 14 and rotates to make contact with banking pin 13.

There are two additional options regarding the slope combinations of the two pairs of lifting fingers 26,27 and 28,29. A first option would have both pairs of lifting fingers as straight but tilted, making its combined vertical and horizontal motions more synchronous. A second option would include all four of the lifting fingers with a radius of curvature. The combined vertical and horizontal motions would also be more synchronous but with a slight rotational motion about the wafer's central axis.

As described, this invention has several advantages over the prior art. It eliminates the need for a highly precision handling robot needing frequent maintenance and calibration due to position drifting particularly with the ever increasing wafer and chamber sizes. A wafer's edge damage can be attributed to a robot's faulty position control. Improper wafer positioning on a wafer chuck within a PVD chamber can cause a skewed etch rate map that can affect process reliability as well as production yield.

Figure 9:
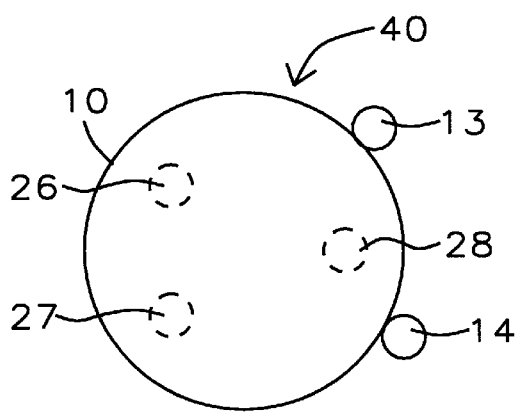
FIG. 9 is a schematic top view of a wafer chuck similar to the embodiment of FIG. 2.

An alternate wafer chuck 40 is shown in FIG. 9. having a pair of linear and biased wafer lifting fingers 26, 27 disposed distally relative the wafer banking pins 13, 14 and working in conjunction with a single curvilinear wafer lifter finger 28 disposed proximal relative the wafer banking pins. The three lifting fingers 26, 27, 28 substantially divide the support platform 12 into three equal segments to provide a three point balanced lift of the wafer. The operating sequence of the alternate chuck 40 is the same as that for chuck 20.

While the invention has been particularly shown and described with reference to the preferred embodiments thereof, it will be understood by those skilled in the art that various changes in form and details may be made without departing from the spirit and scope of the invention.

What is claimed is:

1. A wafer chuck for positioning and releasably holding a wafer comprising:

a support platform having an upper surface means for receiving, positioning, and supporting thereon the wafer;

wafer banking pins affixed to said support platform used for positioning said wafer;

a device for lowering and raising the wafer;

a lifting device acting on the wafer when it rests on the support platform to move the wafer hoizontally relative to said support platform in a slanted direction away from said support platform, said lifting device having a plurality of wafer lifting fingers, said wafer lifting fingers cooperatively extending in two pairs in a slanted but substantially vertical direction, a first pair moving in a linear slanted direction, a second pair moving in a curvilinear direction, said two pairs extending synchronously, said wafer lifting fingers disposed in a pattern to be supportive of said wafer, each of said wafer lifting fingers having an end portion movable relative to said support platform, between a first retracted position in which it is lowered from the upper surface means of said support platform and a second extended position in which it is raised beyond the upper surface menas of said support platform so as to engage the wafer for lifting it relative to said support platform, a driving means to collectively engage distal ends of said pairs of wafer lifting fingers for moving said pairs of wafer lifting fingers between said first and second positions, wherein said driving means is disposed so as to be effectively associated with the distal end portions of said wafer lifting fingers.

2. A wafer chuck according to claim 1, wherein said wafer chuck includes at least two pairs of wafer lifting fingers, said pairs are driven synchronously in a slanted direction, said direction is substantially vertical with a horizontal component which tilts and rotates the wafer towards said banking pins when lowering the wafer and away from said banking pins when raising the wafer.

3. A wafer chuck according to claim 2, wherein after lowering the wafer onto said support platform, a horizontal component of said wafer lifting fingers slide ably drives the wafer against said wafer banking pins thereby establishing a wafer home position relative to said support platform.

4. A wafer chuck according to claim 3, whereby said wafer home position established on the wafer support platform by the engagement of the wafer against said wafer banking pins also provides a wafer pick-up and dropoff location, at the extended position, for a mechanized wafer handling apparatus.

5. A wafer chuck according to claim 1 wherein said first pair of wafer lifting fingers are disposed distally said wafer banking pins.

6. A wafer chuck according to claim 1 wherein said second pair of wafer lifting fingers are disposed proximal said wafer banking pins.

7. A wafer chuck according to claim 1 wherein said second pair of wafer lifting fingers moving in a substantially vertical and curvilinear direction lags the first pair of lifting fingers moving in a substantially vertical and linearly slanted direction during the wafer lifting sequence thereby permitting a horizontal component of the first pair of wafer lifting fingers to pull the wafer away from said wafer banking pins at the beginning of the wafer lifting sequence.

8. A wafer chuck according to claim 1 wherein said second pair of wafer lifting fingers moving in a substantially vertical and curvilinear direction precedes the first pair of lifting fingers moving in a substantially vertical and linearly slanted direction during the wafer lowering sequence thereby permitting a horizontal component of the first pair of wafer lifting fingers to gently push the wafer towards said wafer banking pins as the wafer approaches said support platform.

9. A wafer chuck for positioning and releasably holding a wafer comprising:
- a support platform, having an upper surface means for positioning and supporting thereon the water;
- wafer banking pins affixed to said support platform used for positioning said wafer;
- a lifting device acting on the wafer when it rests on the support platform to move the wafer vertically relative to said support platform in a slanted direction away from said support platform, said lifting device having a set of three wafer lifting fingers, a first and a second wafer lifting fingers disposed distally relative the wafer banking pins, moving in a linear slanted direction and in conjunction with a single curvilinear wafer lifting finger, said set of three wafer lifting fingers cooperatively extending in a slanted but substantially vertical direction, said three wafer lifting fingers substantially divide the support platform into three equal segments providing a three point distributed contact under the wafer for producing a balanced and uniform lifting motion the wafers said three wafer lifting fingers extending synchronously, said wafer lifting fingers disposed in a pattern to be supportive of said wafer, each of said wafer lifting fingers having an end portion movable, relative to said support platform, between a first retracted position in which it is lowered from the upper surface of said support platform and a second extended position in which it is raised beyond the upper surface of said support platform so as to engage the wafer for lifting it relative to said support platform,
- a driving means to collectively engage distal ends of said wafer lifting fingers for moving said wafer lifting fingers between said first and second positions, wherein said driving means is disposed so as to be effectively associated with the distal end portions of said wafer lifting fingers.

10. A wafer chuck according to claim 9, wherein said wafer lifting fingers are driven synchronously in a slanted direction, said slanted direction is substantially vertical with a horizontal component that moves the wafer towards said banking pins when lowering the wafer and away from said banking pins when raising the wafer.

11. A wafer chuck according to claim 10, wherein said horizontal component of said wafer lifting fingers slide ably drives the wafer against said wafer banking pins thereby establishing a wafer home position after lowering of the wafer onto said support platform.

12. A wafer chuck according to claim 9, whereby said wafer home position established on the support platform by the engagement of the wafer against said wafer banking pins also provides a wafer pick-up and drop-off location, in the extended position, for a wafer handling robot.

13. A wafer chuck according to claim 9, wherein said first and second wafer lifting fingers are disposed distally said wafer banking pins.

14. A wafer chuck according to claim 9, wherein said single curvilinear wafer lifting finger is disposed proximal said wafer banking pins.

15. A wafer chuck according to claim 9, wherein said single curvilinear wafer lifting finger moving in a curvilinear and substantially vertical direction lags the first and second wafer lifting fingers which move in a substantially vertical and linearly slanted direction during the wafer lifting sequence thereby permitting a horizontal component of the first and second wafer lifting fingers to pull the wafer away from said wafer banking pins at the beginning of the wafer lifting sequence.

16. A wafer chuck according to claim 9, wherein said single curvilinear wafer lifting finger moving in a curvilinear and substantially vertical direction precedes the first and second lifting fingers moving in a substantially vertical and linearly slanted direction during the wafer lowering sequence thereby permitting a horizontal component of the first and second wafer lifting fingers to gently push the wafer towards said wafer banking pins as the wafer approaches said support platform.

17. A method for aligning a semiconductor wafer within a vacuum chamber comprising the steps of:
- providing a robot;
- providing a wafer chuck with a wafer lifting device said robot positioning a wafer above said wafer chuck within said vacuum chamber;
- said wafer lifting device rising in a substantially vertical and slanted direction to an extended horizontal level to receive said wafer from said robot;
- said robot releasing said wafer onto said wafer lifting device of said wafer chuck;

said wafer lifting device lowering said wafer in a substantially vertical and slanted direction while tilting and rotating said wafer relative to a horizontal plane, thereby positioning said wafer against wafer banking pins affixed and projecting above a wafer support platform of said wafer chuck;

retracting said wafer lifting device to below the upper surface of the wafer support platform of said wafer chuck;

after processing said wafer, said wafer lifting device of said wafer chuck rising to tilt and rotate said wafer away from mid wafer banking pins lifting said wafer to said extended level to be taken by said robot.

18. The method according to claim 17, wherein said lifting device includes two pairs of coupled lifting fingers cooperatively extending and retracting in a slanted but substantially vertical direction, a first pair having moving means to extend and retract in a curvilinear direction, a second pair to extend and retract in a linear but slanted direction said two pairs synchronously coupled to move in a lifting direction, said wafer lifting fingers disposed in a pattern to be supportive of said wafer, each of said wafer lifting fingers having an end portion movable, relative to said support platform, between a first retracted position in which it is lowered from an upper surface of said wafer support platform and a second extended position in which it is raised beyond the upper surface of said wafer support platform so as to engage the wafer for lifting it relative to said wafer support platform.

19. The method according to claim 17, wherein said tilting and rotating said wafer by said lifting device eliminates edge damage to said wafer.

20. The method according to claim 17, wherein said wafer banking pins establishes a wafer processing position.

21. The method according to claim 17, wherein said wafer banking pins also establishes a robot's wafer delivery and pick-up position at an elevated level.

* * * * *

UNITED STATES PATENT AND TRADEMARK OFFICE
CERTIFICATE OF CORRECTION

PATENT NO. : 6,183,189 B1
DATED : February 6, 2001
INVENTOR(S) : Erzhuang Liu, Xiaosong Tang, Yih-Shung Lin, Charles Lin It is certified that error appears in the above-identified patent and that said Letters Patent is hereby corrected as shown below:

Title page,
Item [75], correct "Erzhuang Lzu" so that it read -- Erzhuang Liu --

Signed and Sealed this

Sixteenth Day of October, 2001

Attest:

NICHOLAS P. GODICI
Attesting Officer   Acting Director of the United States Patent and Trademark Office